(12) United States Patent
Loopstra

(10) Patent No.: US 6,987,278 B2
(45) Date of Patent: *Jan. 17, 2006

(54) GAS FLUSHING SYSTEM WITH RECOVERY SYSTEM FOR USE IN LITHOGRAPHIC APPARATUS

(75) Inventor: Erik R. Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 28 days.

This patent is subject to a terminal disclaimer.

(21) Appl. No.: 10/376,640

(22) Filed: Mar. 3, 2003

(65) Prior Publication Data

US 2003/0146396 A1 Aug. 7, 2003

Related U.S. Application Data

(63) Continuation of application No. 09/704,581, filed on Nov. 3, 2000, now Pat. No. 6,555,834.

(30) Foreign Application Priority Data

Nov. 5, 1999 (EP) .......................................... 99203670

(51) Int. Cl.
*G21G 5/00* (2006.01)
*G21G 4/00* (2006.01)
*G03B 27/42* (2006.01)
*G03B 27/52* (2006.01)

(52) U.S. Cl. ............................. 250/492.3; 250/492.22; 355/30; 355/53; 355/55

(58) Field of Classification Search .............. 250/492.3, 250/492.22, 493, 492.21; 355/30, 53, 55
See application file for complete search history.

(56) References Cited

U.S. PATENT DOCUMENTS

| 4,920,505 | A | | 4/1990 | Suzuki ........................ 364/525 |
|---|---|---|---|---|
| 4,989,031 | A | | 1/1991 | Kamiya ....................... 355/30 |
| 5,559,584 | A | * | 9/1996 | Miyaji et al. ................ 355/73 |
| 5,607,647 | A | | 3/1997 | Kinkead ...................... 422/122 |
| 5,719,698 | A | | 2/1998 | Hiraiwa et al. .............. 359/355 |
| 5,853,962 | A | | 12/1998 | Bowers ........................ 430/331 |
| 5,870,196 | A | | 2/1999 | Sogard et al. ............... 356/358 |
| 5,870,197 | A | | 2/1999 | Sogard et al. ............... 356/358 |
| 5,877,843 | A | | 3/1999 | Takagi et al. ................ 355/30 |
| 5,982,475 | A | | 11/1999 | Bruning ....................... 355/53 |
| 6,038,015 | A | * | 3/2000 | Kawata ........................ 355/67 |
| 6,296,990 | B1 | | 10/2001 | Kwan ........................... 430/322 |
| 6,555,834 | B1 | * | 4/2003 | Loopstra ..................... 250/492.3 |
| 2002/0145711 | A1 | * | 10/2002 | Magome et al. ............. 355/30 |

FOREIGN PATENT DOCUMENTS

| EP | 0 838 728 A2 | | 4/1998 |
|---|---|---|---|
| JP | 08-166207 | | 6/1996 |
| JP | 09-022121 | | 1/1997 |
| JP | WO 99/25010 | * | 5/1999 |

* cited by examiner

*Primary Examiner*—John R. Lee
*Assistant Examiner*—Kalimah Fernandez
(74) *Attorney, Agent, or Firm*—Pillsbury Winthrop LLP

(57) ABSTRACT

In a lithographic apparatus using exposure radiation of a relatively short wavelength, e.g. 157 or 126 nm, a laminar flow of $N_2$ is provided across parts of the beam path in or adjacent to moving components of the apparatus. The laminar flow is faster than the maximum speed of the moving components and the diffusion rate of air thereby minimizing the contamination of the $N_2$ by mixing with air. Laminar flow may be ensured by providing partitions to divide the beam path into separate spaces, by covering rough or non-planar surfaces in components on or adjacent to the laminar flow and by providing aerodynamic members.

16 Claims, 2 Drawing Sheets

GAS FLUSHING SYSTEM WITH RECOVERY SYSTEM FOR USE IN LITHOGRAPHIC APPARATUS

This application is a continuation of U.S. Patent Application No. 09/704,581 which was filed Nov. 3, 2000, which in turn claims priority to European Patent Application No. 99203670.7, filed Nov. 5, 1999, both of which are herein incorporated by reference in their entireties.

FIELD OF THE INVENTION

The present invention relates to the use of gas flushing in lithographic apparatus. More particularly, the invention relates to the use of such a gas flushing system in lithographic projection apparatus comprising:

a radiation system for supplying a projection beam of radiation;

a first object table for holding a mask;

a second object table for holding a substrate; and a projection system for imaging an irradiated portion of the mask onto a target portion of the substrate.

DESCRIPTION OF RELATED ART

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The illumination system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatus are described in International Patent Applications WO 98/28665 and WO 98/40791, for example.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (which may comprise one or more dies) on a substrate (silicon wafer) which has been coated with a layer of photosensitive material (resist). In general, a single wafer will contain a whole network of adjacent dies that are successively irradiated via the reticle, one at a time. In one type of lithographic projection apparatus, each die is irradiated by exposing the entire reticle pattern onto the die at once; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed V at which the wafer table is scanned will be a factor M times that at which the reticle table is scanned. More information with regard to lithographic devices as here described can be gleaned from International Patent Application WO 97/33205.

To reduce the size of features that can be imaged, it is desirable to reduce the wavelength of the illumination wavelength. To such end, it has been proposed to use wavelengths of less than about 200 nm, for example 157 nm or 126 nm. However, such wavelengths are strongly absorbed by normal atmospheric air leading to unacceptable loss of intensity as the beam traverses the apparatus. To enclose the entire apparatus and operate in vacuum would introduce unacceptable delays in wafer and reticle exchange whereas to flush the entire apparatus with a gas which does not absorb the illumination wavelength, such as ultra-pure nitrogen (N2), would result in excessive operating costs due to the consumption of the gas in an imperfectly closed machine.

SUMMARY OF THE INVENTION

An object of the present invention is to provide a system for reducing absorption of the illumination and projection beams in a lithographic projection apparatus while avoiding detrimental effects on the throughput and maintenance overhead of the apparatus as well as reducing the use of expensive consumables.

According to the present invention there is provided a lithographic projection apparatus comprising:

a radiation system for supplying a projection beam of radiation;

a first object table for holding a mask;

a second object table for holding a substrate; and a projection system for imaging an irradiated portion of the mask onto a target portion of the substrate; characterized by:

flushing gas means for generating a substantially laminar flow of flushing gas across at least a part of the path of said projection beam to displace ambient air therefrom, said flushing gas being substantially non-absorbent of said radiation of said projection system.

In embodiments of the present invention, the spaces traversed by the projection beam are flushed with a laminar flow of ultra-pure nitrogen (N2), or other gas (e.g. Helium, Argon or Xenon) transparent to the illumination radiation used. To ensure laminar flow and minimize turbulence, the various spaces are separated from one another and all parts are smoothed as far as possible. The effective Reynolds number of the system is thereby reduced, because of the reduction of the hydraulic diameter of the system and because relatively rough areas are covered. The flow speed of the nitrogen in each space is maintained higher than the maximum speed of any moving parts in that space and, in all cases, higher than the diffusion speed of air. In this way, and due to the minimization of turbulence vortices, contamination of the flushing gas is minimized and the gas may be recovered and re-used. Re-use of the gas may be in the same area from which it was recovered or may be elsewhere, e.g in a cascade fashion. In such an arrangement, fresh flushing gas is supplied to the most critical area(s) and then re-used in successively less critical areas. The flushing gas may of course be cleaned or scrubbed before re-use and mixed with fresh gas as desired to control contamination levels.

In this way, the invention minimizes absorption of the illumination radiation and minimizes consumption of flushing gas while avoiding the need for sealing the apparatus and hence minimizing downtime in wafer and reticle exchange.

According to a further aspect of the invention there is provided a method of manufacturing a device using a lithographic projection apparatus including:

a radiation system for generating an illumination beam;

a first object table for holding a mask;

a second object table for holding a substrate; and a projection system for imaging irradiated portions of the mask onto target portions of the substrate; the method comprising the steps of:

providing a mask bearing a pattern to said first object table;

providing a substrate provided with a radiation-sensitive layer to said second object table;

irradiating portions of the mask and imaging said irradiated portions of the mask onto said target portions of said substrate; characterized by the step of:

providing flushing gas to flow in a substantially laminar flow across at least a part of the beam path of said projection beam to displace therefrom ambient air, said flushing gas being substantially non-absorbent of said radiation of said projection system.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms illumination radiation and illumination beam should not be read as being restricted to the cited examples of 157 or 126 nm electromagnetic radiation; it is conceivable that other radiation wavelengths or types may be used in the present invention.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION OF THE INVENTION

Embodiment 1

Figure 1:
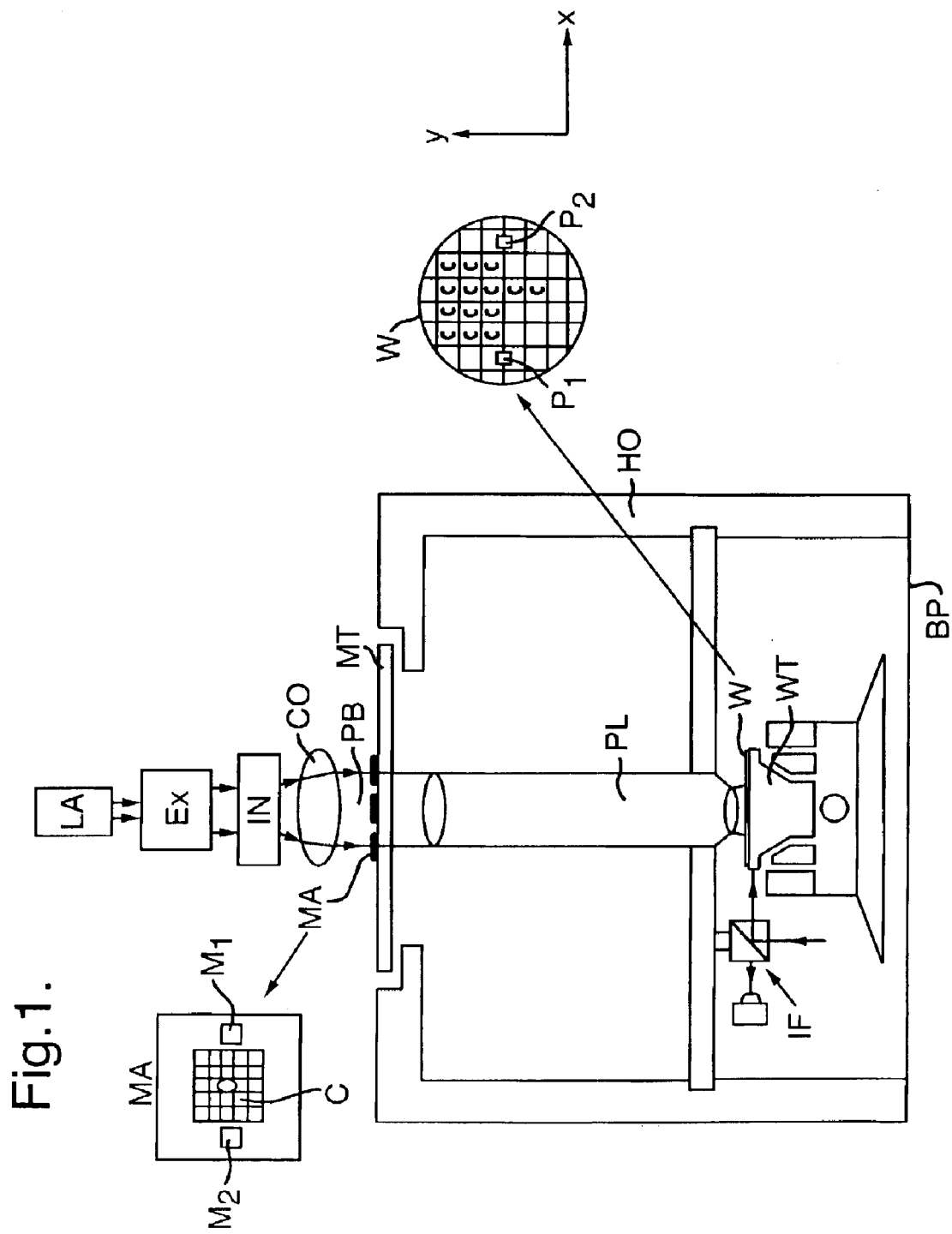
FIG. 1 depicts a lithographic projection apparatus according to a first embodiment of the invention.

FIG. 1 schematically depicts a lithographic projection apparatus according to the invention. The apparatus comprises:

a radiation system LA, Ex, IN, CO for supplying a projection beam PB of radiation;

a first object table (mask table) MT for holding a mask MA (e.g. a reticle), and connected to first positioning means for accurately positioning the mask with respect to item PL;

a second object table (substrate table) WT for holding a substrate W (e.g. a resist-coated silicon wafer), and connected to second positioning means for accurately positioning the substrate with respect to item PL;

a projection system ("lens") PL for imaging an irradiated portion of the mask MA onto a target portion C (die) of the substrate W.

As here depicted, the apparatus is of a transmissive type (i.e. has a transmissive mask). However, in general, it may also be of a reflective type, for example.

The radiation system comprises a source LA that produces a beam of radiation. This beam is passed along various optical components comprised in an illumination system,— e.g. beam shaping optics Ex, an integrator IN and a condenser CO—so that the resultant beam PB is of a desired cross-section and uniformly intense throughout its area.

The beam PB subsequently intercepts the mask MA which is held on a mask table MT. Having passed through the mask MA, the beam PB passes through the lens PL, which focuses the beam PB onto a target portion C of the substrate W. With the aid of the interferometric displacement and measuring means IF, the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long stroke module (course positioning) and a short stroke module (fine positioning), which are not explicitly depicted in FIG. 1. In the case of a waferstepper (as opposed to a step-and-scan apparatus) the mask table may be connected to a short stroke positioning module only, or it may just be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given reference direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In what follows, it will be assumed that the radiation system produces UV light with a wavelength of 157 nm.

According to the invention, the spaces in the apparatus that are traversed by the illumination beam, both before and after it has passed through the mask, are flushed with a laminar flow of flushing gas. The flushing gas may be ultra-pure nitrogen (N2) or other gas or gas mixture sufficiently transparent to the illumination radiation used in the apparatus. N2 has an extinction coefficient, k, at 1 standard atmosphere of less than about 0.0001 per cm traversed, as compared to air at 1 standard atmosphere for which k is approximately 46 per cm traversed. The actual gas pressure in the beam path may be above atmospheric pressure, so that any leak results in an outflow of flushing gas rather than contamination by air, or below atmospheric to reduce beam absorption further. In critical areas, for example the beam delivery and illumination optics, the flushing nitrogen is provided at high purity, i.e. with an air contamination of less than 1 ppm. In less critical areas, such as the projection lens, a contamination of up to 10 ppm can be tolerated while in the reticle and wafer stages contamination levels of up to 100 ppm and up to 500 ppm respectively may be tolerable.

Figure 2:
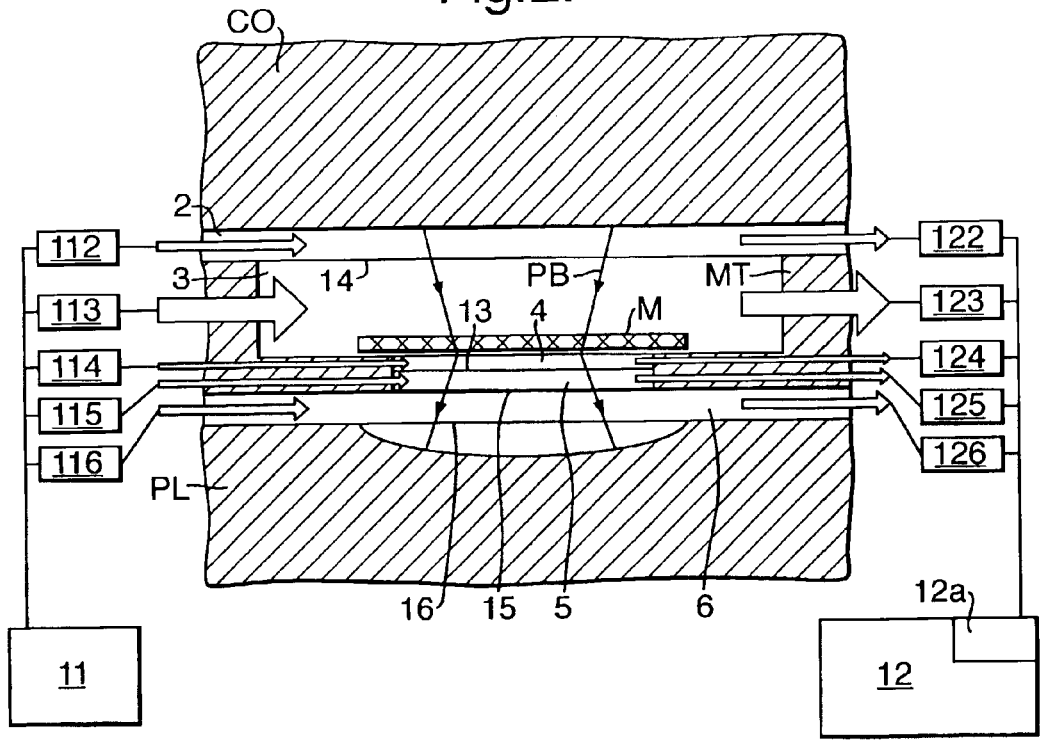
FIG. 2 is an enlarged view of the mask stage of the apparatus of FIG. 1.

FIG. 2 shows the mask stage of the lithographic apparatus according to the invention in greater detail than FIG. 1. It will be seen that the mask M is held in a recess in mask table MT, which can be manufactured from a ceramic material such as Zerodur (RTM) and is positioned by a drive system (not shown) during operation of the lithography apparatus. The mask table MT is closely sandwiched between the last element of the collimating optics CO, which generate the projection beam PB, and the first element of the projection lens system PL, which projects the projection beam PB, having traversed the mask M, onto the wafer W (shown in FIGS. 1 and 3).

The mask stage is divided into zones or spaces 2 to 6 as follows: space 2 is between the final illuminator optics CO and mask table MT; space 3 is within the mask table MT above the mask M; space 4 is within the mask table MT, between the mask M and pellicle 13; space 5 is within the mask table MT below the pellicle 13; and space 6 is between the mask table MT and projection lens system PL. Each of the spaces is flushed with a substantially laminar flow of flushing gas provided from flushing gas supply 11 via respective flow regulators 112 to 116. At the other side of each space the flushing gas is removed to reservoir 12 via respective vacuum pumps 122 to 126. Reservoir 12 may be partitioned to allow controlled re-use of the gas in selected spaces and may include devices 12a to clean or scrub the recovered gas.

To ensure laminar flow, the various spaces in the mask stage can be separated from one another. In particular, a thin sheet 14, e.g. of a material substantially transmissive to the employed radiation, such as CaF2 or fused SiO2, for example, is provided to cover the recess in the mask table MT and separate space 2 from space 3. Flow regulators 112, 113 and vacuum pumps 122, 123 are controlled to ensure that there is no, or only minimal, pressure differential between these two spaces to avoid loading sheet 14. Sheet 14 is arranged to be easily dismountable and replaceable during reticle exchange. Similarly, space 5, below pellicle 13, is closed off from space 6, between the mask table MT and projection lens PL, by a second thin sheet 15 which may be made of CaF2 or fused SiO2. Sheets 14 and 15 may also be made of MgF2, BaF2 or any other suitable material that transmits radiation at the wavelength used in the apparatus. Similar sheets may also be used to cover any irregularities or dead spaces in the system. For example, a third sheet 16 may be used to cover the non-flat surface of the first element of the projection lens system PL. Sheets 14 and 15 and their like form partitions to isolate parts of the beam path in which the laminar flushing gas flow is provided. It should be noted that sheets 14, 15 and 16 are provided to smooth the laminar flow of flushing gas and need not be gas-tight, nor necessarily form a gas-tight seal to the parts to which they are connected.

To supply and remove the gas flow to spaces 3, 4 and 5, within the mask table MT, appropriate conduits are provided in the body of the mask table. When the mask table has been exposed to air, e.g. after a period of non-operation of the apparatus or after mask exchange, flushing gas is supplied for a short period before an exposure is taken to flush out any air that may have accumulated in non-flat parts of the mask table, e.g fiducials.

In this embodiment a pellicle is provided and may be made of solid SiO2 or CaF2. Fused silica (SiO2) which has an improved transmission at 157 nm may also be used. Polymer pellicles are preferably avoided to avoid diffusion across them. In some embodiments of the invention the pellicle may be omitted altogether in which case the flushing gas supply is simplified.

In any of the spaces, aerodynamic features such as small strips or fins may be provided as desired to smooth or guide the flushing gas flow and eliminate or control vortex production. The gas supply and evacuation conduits, particularly in spaces 2 and 6, are positioned to minimize the length of the gas flow to reduce the opportunity for mixing with air.

Figure 3:
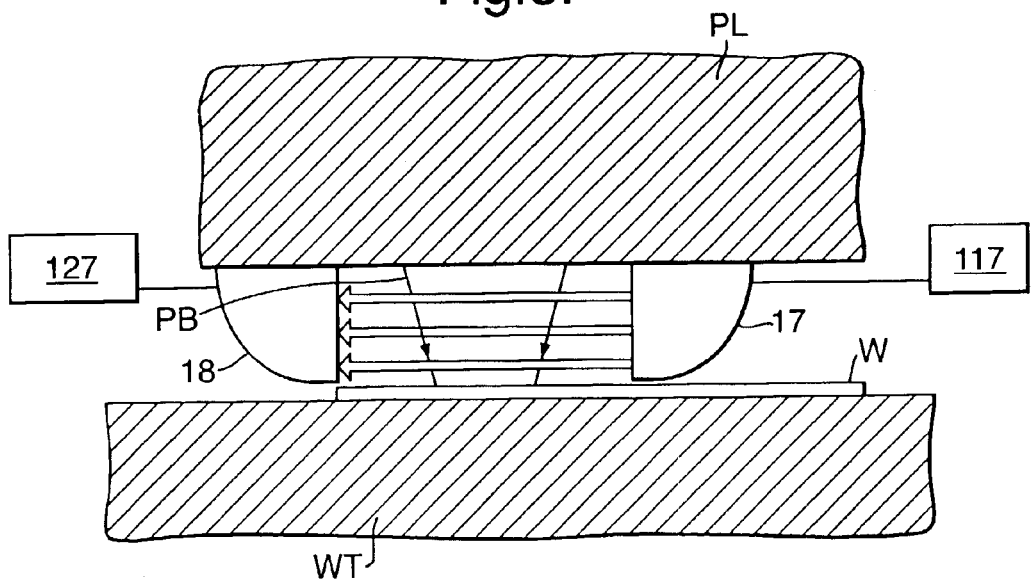
FIG. 3 is an enlarged view of the wafer stage of the embodiment of FIG. 1.

FIG. 3 shows the wafer stage of the lithographic apparatus of FIG. 1. In the wafer stage there is only a single space to be flushed—between the last element of the projection lens system PL and the wafer W. To avoid having to provide a flushing gas path covering the entire range of movement of the wafer stage, the flushing gas supply outlets 17 and evacuation inlets 18 are mounted on the lower end of the projection lens system PL, either side of the final element. Outlets 17 and inlets 18 are respectively connected to the flushing gas supply 11 and reservoir 12 via flow regulator 117 and vacuum pump 127 respectively. The outlets 17 in particular, but also the inlets 18, may be provided with vanes to guide the flow of flushing gas. If not already flat, the final element of the projection lens system PL may be covered with a thin sheet as discussed above.

The flow regulators 112 to 117 mentioned above may comprise static or controllable pressure or flow reducers and/or blowers as required to provide the necessary gas flow rates for the particular embodiment and the available gas supply.

As described above, a laminar flow of flushing gas can be used to reduce absorption of the illumination beam in the moving parts of the lithography device without leading to excessive consumption of the flushing gas. Similar arrangements may also be used in the static components, such as the illumination beam generator and shaper and the projection lens system. However, it is simpler to seal static components than it is to seal moving components and it so may be more convenient to do so and maintain the static components under vacuum or with a static fill of transparent gas such as N2.

While we have described above a specific embodiment of the invention it will be appreciated that the invention may be practiced otherwise than described. The description is not intended to limit the invention. In particular, it will be appreciated that the invention may be used in either or both the mask or substrate stage of a lithographic apparatus, and in any other type of apparatus employing a short wavelength radiation beam.

What is claimed is:

1. A lithographic projection apparatus comprising:
   a radiation system constructed and arranged to supply a projection beam of radiation;
   a first object table for holding a mask;
   a second object table for holding a substrate;
   a projection system constructed and arranged to image an irradiated portion of the mask onto a target portion of the substrate; and
   a gas structure constructed and arranged to supply a substantially laminar flow of flushing gas across at least a part of a path of said projection beam to displace ambient air therefrom, said flushing gas being substantially non-absorbent of said radiation such that said substantially laminar flow of flushing gas traverses a substantially non-obstructed region in said projection apparatus,
   wherein said gas structure comprises:
      a supply of flushing gas,
      a gas flow regulator,
      an evacuator constructed and arranged to remove flushing gas from said part of said beam path, and
      a gas recovery system constructed and arranged to recover at least part of the flushing gas for further use in the apparatus.

2. The apparatus according to claim 1, wherein said at least part of the flushing gas is reintroduced into said projection apparatus as a substantially laminar flow of gas across at least part of said substantially non-obstructed region.

3. The apparatus according to claim 1, wherein said gas recovery system comprises a scrubbing system constructed and arranged to scrub said at least part of the flushing gas.

4. The apparatus according to claim 3, wherein a number of contaminants in said at least part of the flushing gas is substantially reduced.

5. The apparatus according to claim 1, wherein said at least part of the flushing gas is reintroduced into said projection apparatus along with a fresh supply of flushing gas.

6. The apparatus according to claim 1, wherein said at least part of the flushing gas is reintroduced into said projection apparatus as a laminar flow across said at least part of the path of said projection beam.

7. The apparatus according to claim 1, wherein said at least part of the flushing gas recovered using the recovery system is introduced into a portion of said projection apparatus other than said projection beam.

8. The apparatus according to claim 7, wherein said portion comprises a portion having a contaminant level specification higher than a contaminant level specification of the path of the projection beam.

9. A method of manufacturing a device comprising:
   providing a substrate having a radiation-sensitive layer in a projection apparatus;
   irradiating portions of a mask bearing a pattern with a projection beam of radiation and imaging said irradiated portions of the mask onto target portions of said substrate;
   providing flushing gas to flow in a substantially laminar flow across at least a part of a path of said projection beam to displace therefrom ambient air, said flushing gas being substantially non-absorbent of said radiation, and said laminar flow of flushing gas traversing a substantially non-obstructed region in said projection apparatus,
   evacuating said flushing gas from said at least part of the path of said projection beam, and
   recovering at least part of said flushing gas and reintroducing said at least part of said flushing gas across at least part of said substantially non-obstructed region.

10. The method of manufacturing a device as recited in claim 9, further comprising:
    reintroducing said at least part of the flushing gas into said projection apparatus along with a fresh supply of flushing gas.

11. The method of manufacturing a device as recited in claim 9, further comprising:
    reintroducing said at least part of the flushing gas into said projection apparatus as a laminar flow across said at least part of the path of said projection beam.

12. The method of manufacturing a device as recited in claim 9, further comprising:
    reintroducing said at least part of the flushing gas into a portion of said projection apparatus other than said projection beam.

13. A lithographic projection apparatus comprising:
    a radiation system constructed and arranged to supply a projection beam of radiation;
    a first object table for holding a mask;
    a second object table for holding a substrate;
    a projection system constructed and arranged to image an irradiated portion of the mask onto a target portion of the substrate; and
    a gas structure mounted to an extremity of at least one of said radiation system and said projection system, said gas structure is constructed and arranged to supply a laminar flow of flushing gas across at least a portion of a path of said projection beam, said flushing gas being substantially non-absorbent of said radiation, said gas structure comprises:
    an evacuator constructed and arranged to remove flushing gas from said part of said beam path in a vicinity of said extremity of said at least one of said radiation system and said projection system; and
    a gas recovery system constructed and arranged to recover at least part of the flushing gas and to reintroduce said at least part of the flushing gas into said projection apparatus.

14. A lithographic projection apparatus according to claim 13, wherein said at least part of the flushing gas recovered by said recovery system is reintroduced as a substantially laminar flow of gas across at least part of said beam path.

15. The lithographic projection apparatus according to claim 13, wherein said at least part of the flushing gas is introduced along with a fresh flushing gas.

16. The lithographic projection apparatus according to claim 1,
    wherein the supply of flushing gas is provided through an outlet and said evacuator is provided with an inlet, and said inlet is spaced apart from said outlet and faces said outlet.

* * * * *